US012665549B2

(12) United States Patent (10) Patent No.: US 12,665,549 B2

Elaasar (45) Date of Patent: Jun. 23, 2026

(54) RADIO-FREQUENCY MIXER HAVING TRANSFORMER WITH PASSIVE TERMINATION

(71) Applicant: Apple Inc., Cupertino, CA (US)

(72) Inventor: Omar E Elaasar, San Diego, CA (US)

(73) Assignee: Apple Inc., Cupertino, CA (US)

( * ) Notice: Subject to any disclaimer, the term of this patent is extended or adjusted under 35 U.S.C. 154(b) by 323 days.

(21) Appl. No.: 18/298,139

(22) Filed: Apr. 10, 2023

(65) Prior Publication Data

US 2024/0088835 A1 Mar. 14, 2024

Related U.S. Application Data

(60) Provisional application No. 63/404,714, filed on Sep. 8, 2022.

(51) Int. Cl.
H03D 7/14 (2006.01)
H03D 7/16 (2006.01)

(52) U.S. Cl.
CPC ........... H03D 7/1425 (2013.01); H03D 7/165 (2013.01)

(58) Field of Classification Search
CPC .............................. H03D 7/1425; H03D 7/165
USPC ........................................................ 327/359
See application file for complete search history.

(56) References Cited

U.S. PATENT DOCUMENTS 6,529,721 B1 * 3/2003 Tiller ................... H03D 7/1491
455/333
6,819,914 B2 11/2004 Yan et al.

| | | |
|---|---|---|
| 8,558,605 B1 | 10/2013 | Wang et al. |
| 9,407,379 B2 | 8/2016 | Lau et al. |
| 9,543,995 B1 | 1/2017 | Fabiano et al. |
| 9,577,576 B1 | 2/2017 | Brown, Jr. |
| 10,903,806 B2 | 1/2021 | Anderson et al. |
| 11,095,334 B1 | 8/2021 | Mohammadnezhad et al. |
| 11,271,597 B1 | 3/2022 | Huang et al. |
| 2015/0137869 A1 * | 5/2015 | Akizuki ............... H03D 7/1458 |
| | | 327/359 |

OTHER PUBLICATIONS

Jingzhi Zhang et al., A 21.7-to-41.7-GHz Injection-Locked LO Generation With a Narrowband Low-Frequency Input for Multiband 5G Communications, IEEE Transactions on Microwave Theory and Techniques, Jan. 2020, pp. 170-183, vol. 68, No. 1, IEEE.

* cited by examiner

*Primary Examiner* — Tomi Skibinski

(74) *Attorney, Agent, or Firm* — Treyz Law Group; Jason Tsai

(57) ABSTRACT

An electronic device may include wireless circuitry having a radio-frequency mixer. The mixer may include an input stage, an output stage, and a transformer coupled between the input and output stages. The input stage may include input transistors forming a transconductance cell. The output stage may include two pairs of mixer transistors configured to receive an oscillating signal. The transformer may include a primary coil coupled between the input transistors and a secondary coil coupled between the two pairs of mixer transistors. A harmonic rejection circuit may be coupled to a center tap of the secondary coil. The harmonic rejection circuit may be configured to mitigate harmonic signals that are associated with the oscillating signal and that are generated at the inputs of the output stage. The harmonic rejection circuit may include an inductor, an optional capacitor, an optional current source transistor, or other passive component.

18 Claims, 8 Drawing Sheets

RADIO-FREQUENCY MIXER HAVING TRANSFORMER WITH PASSIVE TERMINATION

This application claims the benefit of U.S. Provisional Patent Application No. 63/404,714, filed Sep. 8, 2022, which is hereby incorporated by reference herein in its entirety.

FIELD

This disclosure relates generally to electronic devices and, more particularly, to electronic devices with wireless communications circuitry.

BACKGROUND

Electronic devices can be provided with wireless communications capabilities. An electronic device with wireless communications capabilities has wireless communications circuitry with one or more antennas. Wireless communications circuitry in the wireless communications circuitry uses the antennas to receive and transmit radio-frequency signals.

The wireless communications circuitry can include a transceiver having one or more mixers. A mixer in the transmit path can be used to modulate signals from a baseband frequency to a radio frequency, whereas a mixer in the receive path can be used to demodulate signals from the radio-frequency to the baseband frequency. Mixers receive clock signals generated from local oscillator circuitry. It can be challenging to design satisfactory mixers and local oscillator circuitry for an electronic device.

SUMMARY

An electronic device may include wireless circuitry. The wireless circuitry may include one or more mixers that receive an oscillating signal. The mixer can be a radio-frequency transmitting mixer or a radio-frequency receiving mixer. A local oscillator can generate the oscillating signal. The mixer can be a transformer based mixer exhibiting improved linearity.

An aspect of the disclosure provides mixer circuitry that includes a first mixer transistor configured to receive an oscillating signal, a transformer having a primary coil and a secondary coil, the secondary coil being coupled to the first mixer transistor, and a passive component coupled to a center tap of the secondary coil in the transformer. The mixer circuitry can further include a second mixer transistor configured to receive the oscillating signal, the secondary coil having a first terminal that is coupled to source terminals of the first and second mixer transistors, a third mixer transistor configured to receive the oscillating signal, and a fourth mixer transistor configured to receive the oscillating signal, the secondary coil having a second terminal that is coupled to source terminals of the third and fourth mixer transistors. The mixer circuitry can further include a first input transistor coupled to a first terminal of the primary coil in the transformer and a second input transistor coupled to a second terminal of the primary coil in the transformer. The passive component can include an inductor having a first terminal coupled to the center tap of the secondary coil and having a second terminal coupled to a power supply line. The mixer circuitry can further include a capacitor coupled in parallel or in series with the inductor and optionally a current source transistor coupled to the inductor.

An aspect of the disclosure provides mixer circuitry that includes a first input transistor, a second input transistor, a transformer having a primary coil coupled between the first and second input transistors and having a secondary coil, and a passive component coupled to a center tap of the secondary coil in the transformer. The mixer circuitry can further include a first pair of mixer transistors coupled to a first terminal of the secondary coil and configured to receive an oscillator signal and a second pair of mixer transistors coupled to a second terminal of the secondary coil and configured to receive the oscillator signal. The passive component can be an inductor. A capacitor can be coupled to the inductor. A current limiting transistor can optionally be coupled to the inductor.

An aspect of the disclosure provides circuitry that includes an input stage, an output stage configured to receive an oscillating signal, a transformer having a primary winding coupled to the input stage and having a secondary winding coupled to the output stage, and a harmonic rejection circuit coupled to a center tap of the secondary winding and configured to mitigate harmonic signals associated with the oscillating signal and generated at the output stage. The input stage can be a transconductance circuit. The output stage can include a first pair of mixing transistors coupled to a first terminal of the secondary winding and a second pair of mixer transistors coupled to a second terminal of the secondary winding. The harmonic rejection circuit can include one or more passive components.

DETAILED DESCRIPTION

Figure 1:
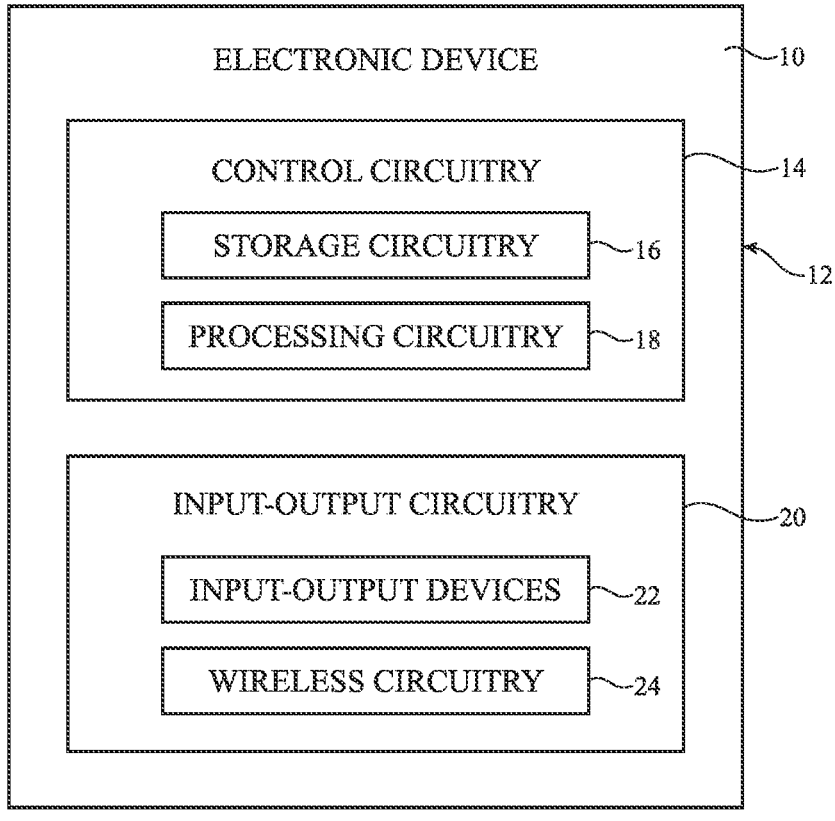
FIG. 1 is a diagram of an illustrative electronic device having wireless circuitry in accordance with some embodiments.

An electronic device such as electronic device 10 of FIG. 1 may be provided with wireless circuitry. The wireless circuitry can include transformer based mixers. A transformer based mixer is a mixer circuit that receives local oscillator signals and that includes a transformer coupled to an active transconductance cell. The transformer may include a primary winding coupled to the active transconductance cell and a secondary winding coupled to a circuit configured to reject both the differential mode and the common mode local oscillator harmonic signals. Such harmonic distortion rejection circuit can include an inductor, a capacitor optionally coupled in parallel with the inductor, a capacitor optionally coupled in series with the inductor, a current limiting device optionally coupled to the inductor, and/or other passive electrical components. Configured and operated in this way, the transformer based mixer can exhibit at least improved third order and fifth order non-linearity performance. Such mixer circuit can be included in any type of electronic device 10.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
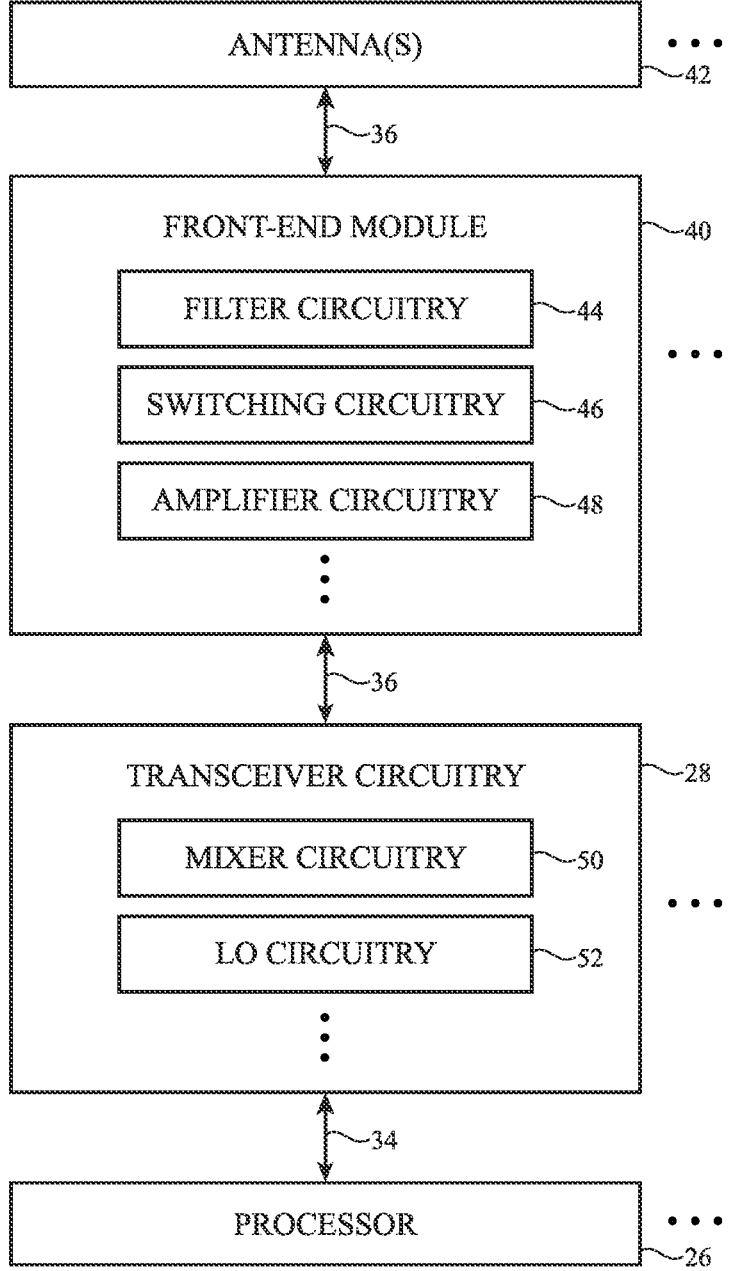
FIG. 2 is a diagram of illustrative wireless circuitry having a transceiver in accordance with some embodiments.

FIG. 2 is a diagram showing illustrative components within wireless circuitry 24. As shown in FIG. 2, wireless circuitry 24 may include one or more processors such as processor(s) 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, an application processor, a digital signal processor, a microcontroller, a microprocessor, a central processing unit (CPU), a programmable device, a combination of these circuits, and/or one or more processors within circuitry 18. Processor 26 may be configured to generate digital (transmit or baseband) signals. Processor 26 may be coupled to transceiver 28 over path 34 (sometimes referred to as a baseband path). Transceiver 28 may be coupled to antenna 42 via radio-frequency transmission line path 36. Radio-frequency front end module 40 may be interposed on radio-frequency transmission line path 36 between transceiver 28 and antenna 42.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 36, any desired number of front end modules 40, and any desired number of antennas 42. Each processor 26 may be coupled to one or more transceiver 28 over respective paths 34. Each transceiver 28 may include a transmitter circuit configured to output uplink signals to antenna 42, may include a receiver circuit configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module interposed thereon.

Front end module (FEM) 40 may include radio-frequency front end circuitry that operates on the radio-frequency signals conveyed (transmitted and/or received) over radio-frequency transmission line path 36. Front end module may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifiers and one or more low-noise amplifiers), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be interposed within radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards. In one suitable arrangement, radio-frequency transmission line paths such as radio-frequency transmission line path 36 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

In performing wireless transmission, processor 26 may provide digital signals to transceiver 28 over path 34. Transceiver 28 may further include circuitry for converting the baseband signals received from processor 26 into corresponding intermediate frequency or radio-frequency signals. For example, transceiver circuitry 28 may include mixer circuitry 50 for up-converting (or modulating) the baseband signals to intermediate frequencies or radio frequencies prior to transmission over antenna 42. Transceiver circuitry 28 may also include digital-to-analog converter (DAC) and/or analog-to-digital converter (ADC) circuitry for converting signals between digital and analog domains. Transceiver 28 may include a transmitter component to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from external wireless equipment. The received radio-frequency signals may be conveyed to transceiver 28 via radio-frequency transmission line path 36 and front end module 40. Transceiver 28 may include circuitry for converting the received radio-frequency signals into corresponding intermediate frequency or baseband signals. For example, transceiver 28 may use mixer circuitry 50 for downconverting (or demodulating) the received radio-frequency signals to baseband frequencies prior to conveying the received signals to processor 26 over path 34. Mixer circuitry 50 can include local oscillator circuitry such as local oscillator (LO) circuitry 52. Local oscillator circuitry 52 can generate oscillator signals that mixer circuitry 50 uses to modulate transmitting signals from baseband frequencies to radio frequencies and/or to demodulate the received signals from radio frequencies to baseband frequencies.

Figure 3:
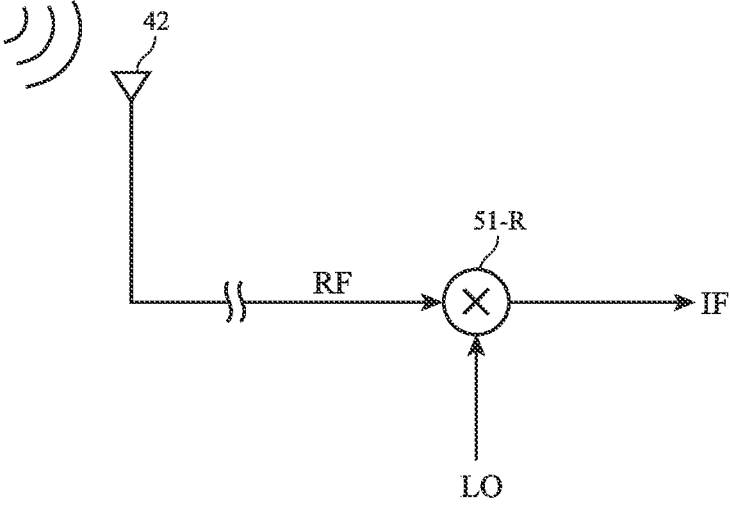
FIG. 3 is a diagram of an illustrative mixer in a receive path in accordance with some embodiments.

FIG. 3 is a diagram of an illustrative mixer in a receive (RX) path of the wireless circuitry. As shown in FIG. 3, antenna 42 may feed received radio-frequency signals to mixer 51-R. Mixer 51-R in the receive (downlink) path may be referred to as a receiving mixer. Mixer 51-R may represent one or more receiving mixers in mixer circuitry 50 shown in FIG. 2. Mixer 51-R may have a first input configured to receive a radio-frequency signal from antenna 42, a second input configured to receive an oscillating signal LO, and an output on which a demodulated signal that is downconverted to an intermediate frequency (IF) range is generated (as an example). One or more components such as a radio-frequency coupler, filter circuitry, antenna tuning element(s), matching network(s), switching circuitry, amplifier circuitry, other radio-frequency front end components, other transceiver components, and/or other wireless components can be disposed in the receive path between antenna 42 and mixer 51-R. Receiving mixer 51-R that receives a radio-frequency signal can be referred to as a radio-frequency mixer.

Figure 4:
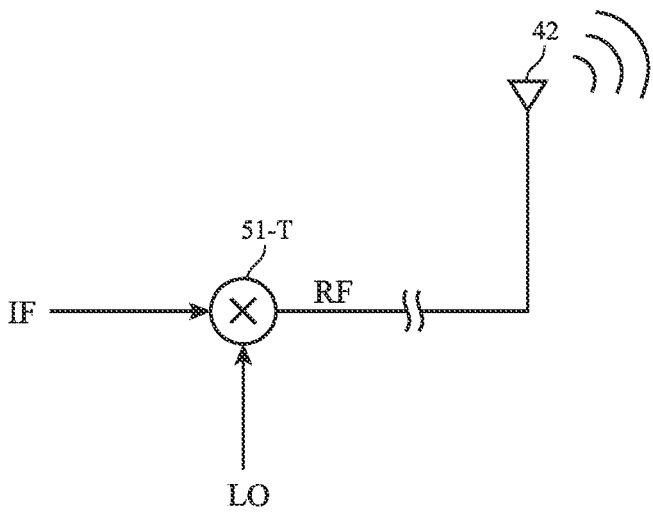
FIG. 4 is a diagram of an illustrative mixer in a transmit path in accordance with some embodiments.

FIG. 4 is a diagram of an illustrative mixer in a transmit (TX) path of the wireless circuitry. As shown in FIG. 4A, mixer 51-T may output radio-frequency signals that are ultimately radiated by antenna 42. Mixer 51-T in the transmit (uplink) path may be referred to as a transmitting mixer. Mixer 51-T may represent one or more transmitting mixers in mixer circuitry 50 shown in FIG. 2. Transmitting mixer 51-T may have a first input configured to receive a signal in the intermediate frequency (IF) range, a second input configured to receive an oscillating signal LO, and an output on which a modulated signal that is upconverted to a radio frequency (RF) range is generated (as an example). One or more components such as a radio-frequency coupler, filter circuitry, antenna tuning element(s), matching network(s), switching circuitry, amplifier circuitry, other radio-frequency front end components, other transceiver components, and/or other wireless components can be disposed in the transmit path between transmitting mixer 51-T and antenna 42. Transmitting mixer 51-T that outputs a radio-frequency signal can be referred to as a radio-frequency mixer.

In accordance with an embodiment, a radio-frequency mixer can include a transformer. Use of a transformer in a mixer can provide a larger voltage headroom for an input stage within the mixer and can provide additional passive current gain from the transformer itself. Since the transformer can decouple the input stage (input portion) from an output stage (output portion) of the mixer, use of the transformer can provide enhanced flexibility in terms of biasing the different portions of the mixer (e.g., the input stage of the mixer can be biased using a first set of bias voltages, whereas the output stage of the mixer can be biased using a second set of bias voltages). A radio-frequency mixer that includes such type of transformer is sometimes referred to and defined herein as a transformer based mixer.

Figure 5A:
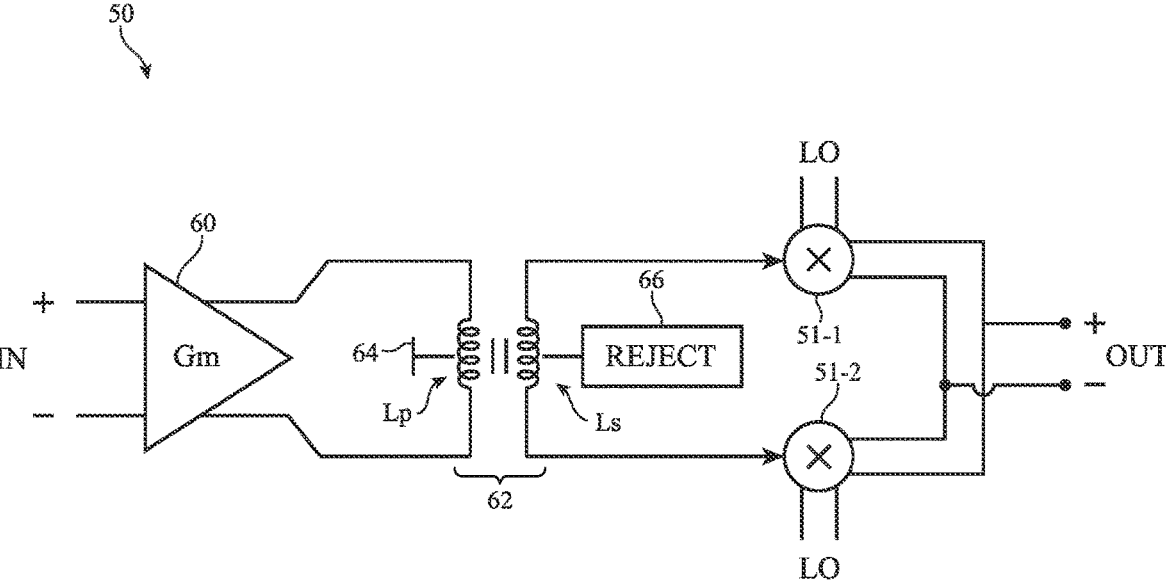
FIG. 5A is a block diagram of illustrative mixer circuitry having a transformer and a local oscillator harmonic rejection circuit coupled to the transformer in accordance with some embodiments.

FIG. 5A is a block diagram of illustrative transformer based mixer circuitry 50. As shown in FIG. 5A, mixer circuitry 50 may include an input stage such as a transconductance (Gm) circuit 60, a transformer such as transformer 62, and an output stage that includes associated mixer subcircuits 51-1 and 51-2. Transconductance circuit 60 may be a differential circuit configured to convert an input voltage received at its differential input port IN to a corresponding output current at its differential output port. The use of a transconductance circuit (sometimes referred to as a Gm cell) as the input stage of mixer circuitry 50 is exemplary. If desired, other types of amplifier, buffer, driver, or input stage can be employed. In some embodiments, the transconductance (Gm) cell 60 can be omitted.

Transformer 62 may include a first winding (coil) such as primary coil Lp and a second winding (coil) such as secondary coil Ls. Primary coil Lp may have a first terminal coupled to a first output terminal of transconductance circuit 60, a second terminal coupled to a second output terminal of transconductance circuit 60, and a center tap terminal coupled to voltage line 64. The first and second output terminals of circuit 60 may collectively form the differential output port of transconductance circuit 60. Voltage line 64 can receive a positive power supply voltage, a ground power supply voltage, a negative power supply voltage, an intermediate voltage between the positive and ground power supply voltages, or other static (direct current or DC) voltage. Secondary coil Ls may have a first terminal coupled to a first mixer subcircuit 51-1 and a second terminal coupled to a second mixer subcircuit 51-2.

First mixer subcircuit 51-1 of the mixer output stage has a first input coupled to the first terminal of secondary coil Ls, a second input configured to receive an oscillating signal LO from a local oscillator (see, e.g., local oscillator circuitry 52 of FIG. 2), and an output coupled to a differential output port OUT of mixer circuitry 50. Second mixer subcircuit 51-2 of the mixer output stage has a first input coupled to the second terminal of secondary coil Ls, a second input also configured to receive local oscillator signal LO, and an output coupled to the differential output port OUT of mixer circuitry 50. The output stage having mixing subcircuits 51-1 and 51-2 is therefore sometimes referred to as a mixing or mixer stage. Transformer 62 is therefore coupled between the input stage 60 and the output stage.

It can be challenging to design a satisfactory radio-frequency mixer. In practice, differential mixer circuits are non-linear circuits whose performance is oftentimes degraded due to intermodulation distortion. Intermodulation distortion arises when at least two signals at different frequencies are applied to a non-linear circuit and when the amplitude modulation or mixing (multiplication) of the two signals when their sum is raised to a power greater than one generates intermodulation products that are not just at harmonic frequencies (integer multiples) of either input signal but also at the sums and differences of the input signal frequencies and also at sums and differences of multiples of those frequencies.

Consider a scenario in which a differential mixer circuit receives two input signals, sometimes referred to as a first tone T1 and a second tone T2. The first tone T1 may be at angular frequency $\omega_1$ (i.e., equal to $2\pi f_1$), whereas the second tone T2 may be at angular frequency $\omega_2$ (i.e., equal to $2\pi f_2$). Angular frequency $\omega_2$ may be greater than $\omega_1$. Of particular interest are the third order intermodulation (IM3) products generated at $(2\omega_1 - \omega_2)$ and $(2\omega_2 - \omega_1)$. If the difference between $\omega_1$ and $\omega_2$ is relatively small, then the IM3 components generated at $(2\omega_1 - \omega_2)$ and $(2\omega_2 - \omega_1)$ can appear in the vicinity of $\omega_1$ and $\omega_2$. The magnitude of these IM3 tones (e.g., the third order tones appearing on either side of the two input signal tones) directly contribute to third order intermodulation distortion (IMD3), which can degrade the signal difference-to-noise ratio (SDNR), the error vector magnitude (EVM), and other performance metrics associated with the wireless circuitry.

The amount of intermodulation distortion at a mixer can be a strong function of harmonics associated with the local oscillator signals. For example, during operation of mixer circuitry 50, the second order harmonic distortion (HD2) and higher order harmonic distortion components of the local oscillator signals LO received at the inputs of mixer subcircuits 51-1 and 52-2 are generated at the mixer input port IN due to the mixing effect and can cause large signal swings at the output of transconductance circuit 60, all of which can negatively impact the linearity, SDNR, EVM, and other performance metrics associated with mixer circuitry 50.

In accordance with an embodiment, mixer circuitry 50 may be provided with a local oscillator harmonic rejection circuit such as local oscillator harmonic rejection circuit 66 coupled to a center tap (common mode) terminal of secondary coil Ls within transformer 62. Harmonic rejection circuit 66 can be configured to reject the harmonic signals generated at the mixer input due to the mixing mechanism, which can help improved the third order, fifth order, or higher order non-linearity performance of mixer circuitry 50. In other words, use of circuit 66 can reduce at least the $3^{rd}$ order intermodulation distortion (IMD3) and the fifth order intermodulation distortion (IMD5), which can help improve the $3^{rd}$ order intercept point (IP3) and the $5^{th}$ order intercept point (IP5) and other non-linearity metrics of mixer circuitry 50.

Figure 5B:
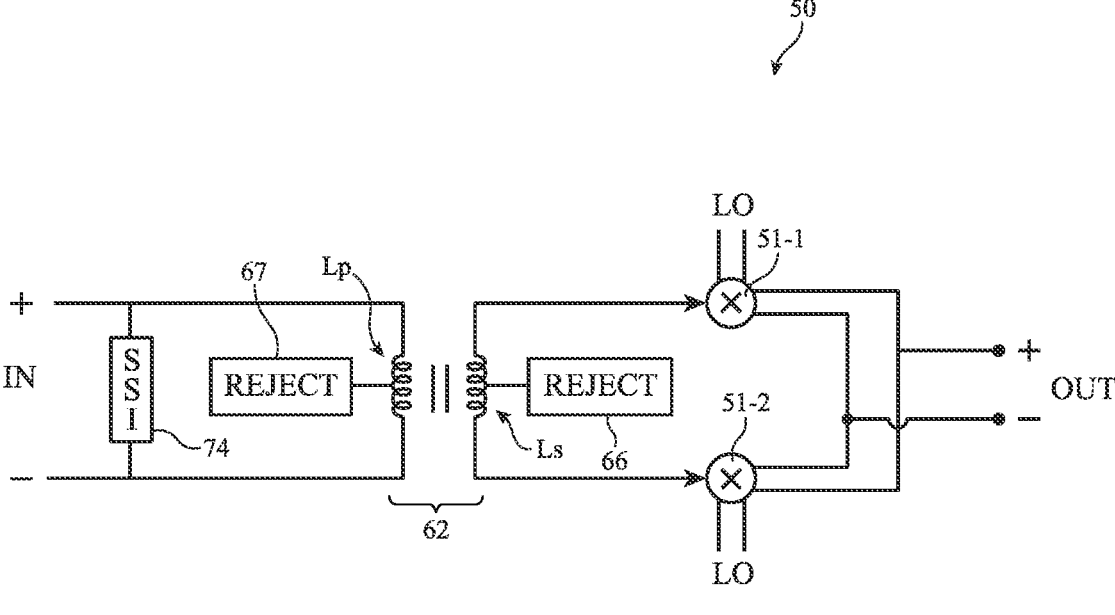
FIG. 5B is a block diagram of illustrative mixer circuitry having a transformer and multiple local oscillator harmonic rejection circuits coupled to the transformer in accordance with some embodiments.

The example of FIG. 5A in which mixer circuitry 50 includes a transconductance circuit 60 and one harmonic rejection circuit 66 is illustrative and not intended to limit the scope of the present embodiments. FIG. 5B shows another embodiment of mixer circuitry 50 that omits the input transconductance (Gm) cell but includes an input transformer 62, and an output stage that includes associated mixer subcircuits 51-1 and 51-2. Transformer 62 may include a first winding (coil) such as primary coil Lp and a second winding (coil) such as secondary coil Ls. Primary coil Lp may have a first terminal coupled to a first (positive) input terminal of mixer 50, a second terminal coupled to a second (negative) input terminal of mixer 50, and a center tap terminal. Secondary coil Ls may have a first terminal coupled to a first mixer subcircuit 51-1 and a second terminal coupled to a second mixer subcircuit 51-2. The positive and negative input terminals collectively serve as an input port of mixer 50.

First mixer subcircuit 51-1 of the mixer output stage has a first input coupled to the first terminal of secondary coil Ls, a second input configured to receive an oscillating signal LO from a local oscillator (see, e.g., local oscillator circuitry 52 of FIG. 2), and an output coupled to a differential output port OUT of mixer circuitry 50. Second mixer subcircuit 51-2 of the mixer output stage has a first input coupled to the second terminal of secondary coil Ls, a second input also configured to receive local oscillator signal LO, and an output coupled to the differential output port OUT of mixer circuitry 50. The output stage having mixing subcircuits 51-1 and 51-2 is therefore sometimes referred to as a mixing or mixer stage. Transformer 62 is therefore coupled between the input stage 60 and the output stage.

In accordance with some embodiments, mixer circuitry 50 of FIG. 5B may be provided with a local oscillator harmonic rejection circuit such as local oscillator harmonic rejection circuit 66 coupled to a center tap (common mode) terminal of secondary coil Ls within transformer 62. Harmonic rejection circuit 66 can be configured to reject the harmonic signals generated at the mixer input due to the mixing mechanism, which can help improved the third order, fifth order, or higher order non-linearity performance of mixer circuitry 50. In other words, use of circuit 66 can reduce at least the $3^{rd}$ order intermodulation distortion (IMD3) and the fifth order intermodulation distortion (IMD5), which can help improve the $3^{rd}$ order intercept point (IP3) and the $5^{th}$ order intercept point (IP5) and other non-linearity metrics of mixer circuitry 50.

Minimizing the strong harmonic signals leaking or propagating to the mixer input port further permits the use of a signal strength indicator (SSI) circuit such as SSI circuit 74 at the mixer input port IN. For example, mixer circuitry 50 in the receive path can include a receive signal strength indicator (RSSI) circuit 74 for precisely measuring the magnitude of the radio-frequency signal received at the input of mixer circuitry 50. SSI circuit 74 may be coupled across the two terminals of the primary coil Lp of transformer 62. In such arrangements, an additional rejection circuit such as rejection circuit 67 can be coupled to the center tap of primary coil Lp. Rejection circuit 67 can be configured to reject the common mode $2^{nd}$ harmonic LO signals that might leak to the SSI circuit 74 and cause errors in the readings of circuit 74. In other words, rejection circuit can be configured to mitigate harmonic signals associated with the LO signal generated at the output stage from leaking into SSI circuit 74. Thus, additional rejection circuit 67 is therefore also sometimes referred to and defined herein as a harmonic rejection circuit, a common mode harmonic rejection circuit, or a local oscillator harmonic rejection circuit.

Figure 6:
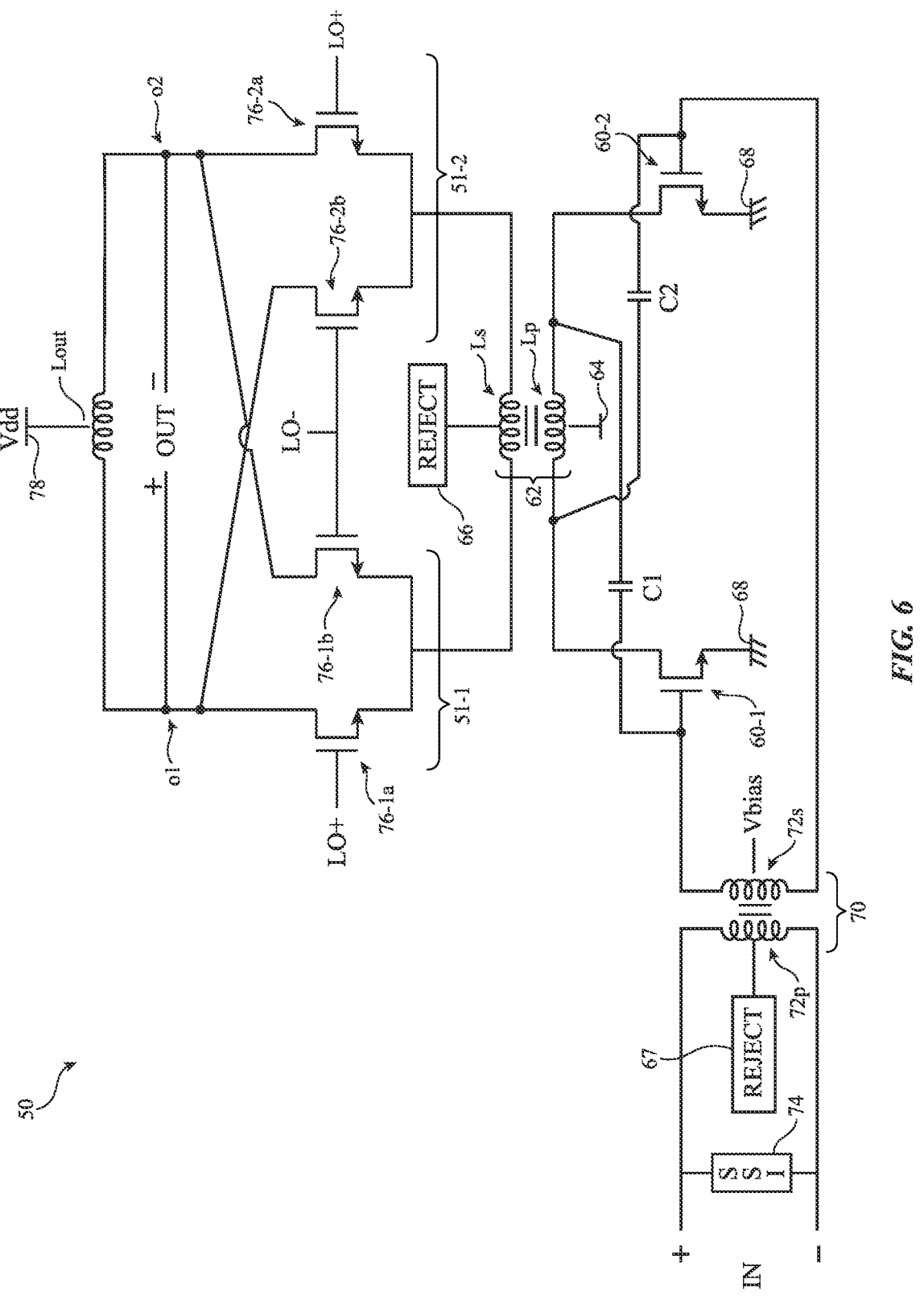
FIG. 6 is a circuit diagram showing an exemplary implementation of mixer circuitry of the type shown in FIG. 5B in accordance with some embodiments.

FIG. 6 is a circuit diagram showing an exemplary implementation of mixer circuitry 50 of the type described in connection with in FIG. 5B. As shown in FIG. 6, the input stage may include a first input transistor 60-1 and a second input transistor 60-2. Input transistors 60-1 and 60-2 can be n-channel devices such as n-type metal-oxide-semiconductor (NMOS) transistors. Input transistors 60-1 and 60-2 can be coupled to an input transformer 70. Input transformer 70 may include a primary coil (winding) 72p coupled to differential input port IN of mixer circuitry 50 and a secondary coil (winding) 72s coupled to the gate terminals of input transistors 60-1 and 60-2. In particular, secondary coil 72s of input transformer 70 may have a first terminal coupled to the gate terminal of input transistor 60-1, a second terminal coupled to the gate terminal of input transistor 60-2, and a center tap terminal configured to receive bias voltage Vbias. Voltage Vbias can be a positive power supply voltage, a ground power supply voltage, a negative power supply voltage, an intermediate voltage between the positive and ground power supply voltages, or other static (direct current or DC) voltage.

Input transistor 60-1 may have a drain terminal coupled to coil Lp, a source terminal coupled to a ground power supply line 68 (e.g., a ground line on which a ground voltage is provided), and a gate terminal coupled to coil 72s. Input transistor 60-2 may have a drain terminal coupled to coil Lp, a source terminal coupled to ground line 68, and a gate terminal coupled to coil 72s. The terms "source" and "drain" terminals used to refer to current-conveying terminals in a transistor may be used interchangeably and are sometimes referred to as "source-drain" terminals. Thus, the drain terminal of transistor 60-1 can sometimes be referred to as a first source-drain terminal, and the source terminal of transistor 60-1 can be referred to as a second source-drain terminal (or vice versa). If desired, capacitors C1 and C2 can be cross-coupled with the input transistors. Capacitor C1 may be coupled between the gate terminal of transistor 60-1 and the drain terminal of transistor 60-2, whereas capacitor C2 may be coupled between the gate terminal of transistor 60-2 and the drain terminal of transistor 60-1. Cross-coupled to the input transistors in this way, capacitors C1 and C2 can be configured to neutralize the parasitic gate-to-drain capacitance of the input transistors and can therefore sometimes be referred to as capacitance neutralization capacitors.

Mixer subcircuit 51-1 can include a first pair of mixer transistors 76-1a and 76-1b. Mixer transistor 76-1a may have a source terminal coupled to secondary coil Ls, a gate terminal configured to receive signal LO+, and a drain terminal coupled to a first output terminal o1. Mixer transistor 76-1b may have a source terminal also coupled to secondary coil Ls, a gate terminal configured to receive signal LO−, and a drain terminal coupled to a second output terminal o2. Signals LO+ and LO− represent the positive and negative polarities of a differential signal and can collectively be referred to as a local oscillator signal or an oscillating signal. The gate terminals of mixer transistors 76-1a and 76-1b collectively form a differential input for receiving the oscillating signal. Output terminals o1 and o2 collectively form the differential output port OUT of mixer circuitry 50. An output inductor Lout can be coupled across the differential output port of mixer circuitry 50. In particular, output inductor Lout may have a first terminal coupled to output terminal o1, a second terminal coupled to output terminal o2, and a center tap terminal coupled to positive power supply line 78 (e.g., a positive power supply terminal on which positive power supply voltage Vdd is provided).

Mixer subcircuit 51-2 can include a second pair of mixer transistors 76-2a and 76-2b. Mixer transistor 76-2a may have a source terminal coupled to secondary coil Ls, a gate terminal configured to receive signal LO+, and a drain terminal coupled to the second output terminal o2. Mixer transistor 76-2b may have a source terminal also coupled to secondary coil Ls, a gate terminal configured to receive signal LO−, and a drain terminal coupled to the first output terminal o1. The gate terminals of mixer transistors 76-2a and 76-2b collectively form a differential input for receiving the oscillating signal.

FIG. 6 also shows secondary coil (winding) Ls of transformer 62 having a first terminal coupled to the source nodes of mixer transistors 76-1a and 76-1b, a second terminal coupled to the source nodes of mixer transistors 76-2a and 76-2b, and a center tap terminal coupled to local oscillator harmonic rejection circuit 66. By being coupled to the center tap terminal of coil Ls, circuit 66 is sometimes referred to as providing common mode termination for coil Ls. As described above, LO harmonic rejection circuit 66 can be configured to reject the harmonic signals leaking or propagating towards the mixer input, which can help improved the third order, fifth order, or higher order non-linearity performance of mixer circuitry 50. Minimizing the strong harmonic signals leaking or propagating to the mixer input port further permits the use of a signal strength indicator (SSI) circuit 74 at the mixer input port IN. For example, mixer circuitry 50 in the receive path can include a receive signal strength indicator (RSSI) circuit 74 for accurately measuring the magnitude of the radio-frequency signal received at the input of mixer circuitry 50. In such arrangements, an additional rejection circuit such as harmonic rejection circuit 67 can be coupled to a center tap of primary coil 72p of transformer 70. Rejection circuit 67 can be configured to reject the common mode $2^{nd}$ harmonic LO signals that might leak to the SSI circuit 74 and cause errors in the measurements of circuit 74. Thus, the use of rejection circuit 67 can be technically advantageous and beneficial by improving the accuracy of SSI circuit 74.

Figure 7:
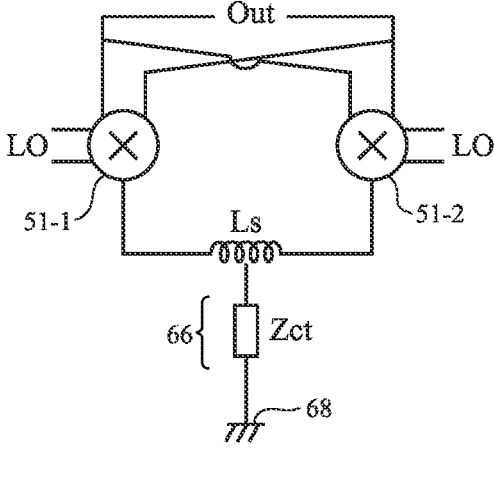
FIGS. 7-10 are diagrams showing different configurations of a local oscillator harmonic rejection circuit that can be included within a transformer based mixer in accordance with some embodiments.

First local oscillator (LO) harmonic rejection circuit 66 and/or second LO harmonic rejection circuit 67 can each be implemented using one or more passive components. FIG. 7 illustrates an example in which LO harmonic rejection circuit 66 is implemented as an impedance component Zct. Impedance component Zct has a first terminal coupled to the center tap of coil Ls and a second terminal shunted to ground line 68. Impedance component Zct can be configured to provide magnetic coupling between a positive portion of coil Ls and a negative portion of coil Ls. Impedance component Zct can represent one or more inductor, one or more capacitor, one or more resistor, or other passive component(s) or load component(s).

Figure 8:
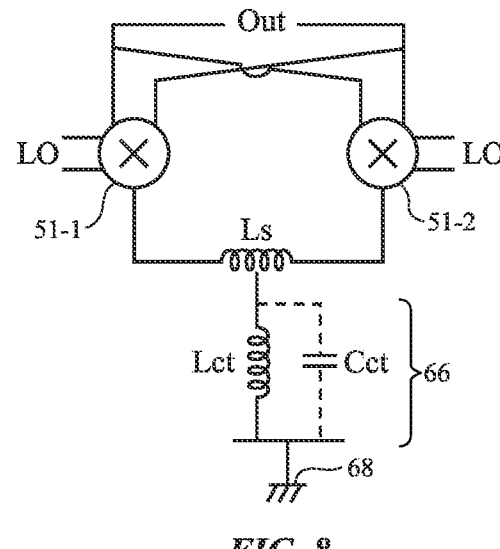

FIG. 8 shows another example in which LO harmonic rejection circuit 66 includes an inductor Lct and an optional capacitor Cct. Inductor Lct may have a first terminal coupled to the center tap of coil Ls and a second terminal coupled to ground line 68. Optional capacitor Cct (if included) may be coupled in parallel with inductor Lct. Circuit 66 having both inductor Lct and capacitor Cct is sometimes referred to as a common mode filter.

Figure 9:
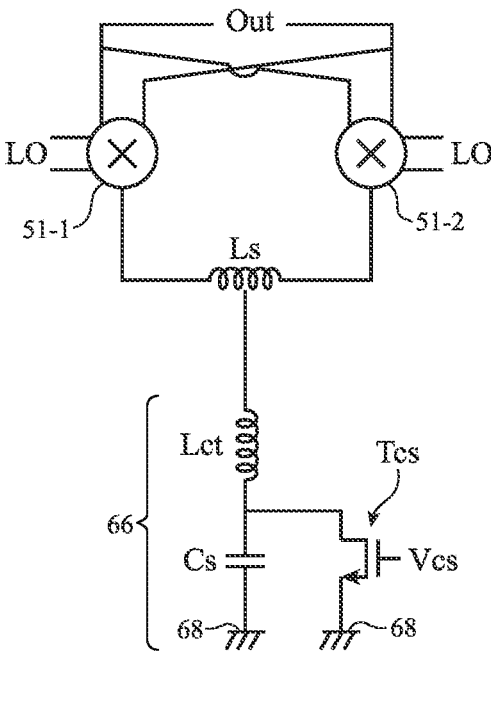

FIG. 9 shows another example in which LO harmonic rejection circuit 66 includes an inductor Lct, a capacitor Cs coupled in series with inductor Lct, and a transistor Tcs. Inductor Lct may have a first terminal coupled to the center tap of coil Ls and a second terminal coupled to ground line 68 via series-connected capacitor Cs. Transistor Tcs may have a source terminal coupled to ground line 68, a drain terminal coupled to a node between inductor Lct and capacitor Cs, and a gate terminal configured to receive control voltage Vcs. Transistor Tcs can serve as a current source or a current limiting device that help provide improved biasing flexibility for the mixing transistors within subcircuits 51-1 and 51-2 (e.g., control voltage Vcs can be adjusted to accommodate the optimum bias point at the gate terminals of the mixer transistors). Transistor Tcs can therefore sometimes be referred to as a current source transistor or a current limiting transistor.

Figure 10:
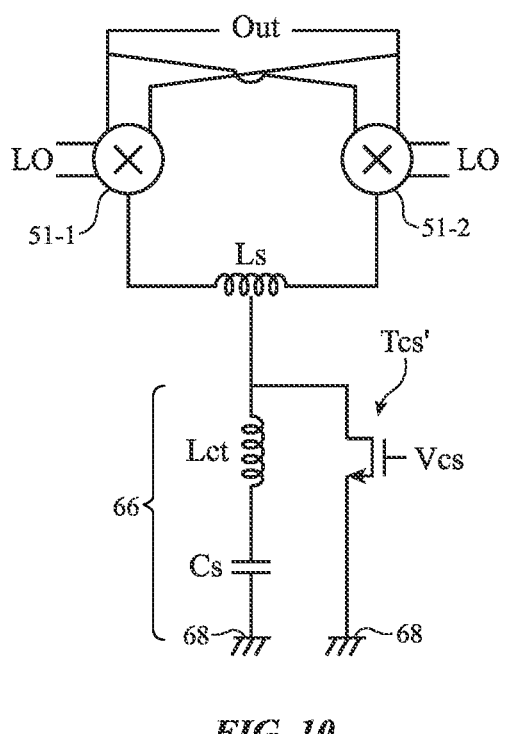

FIG. 10 shows another example in which LO harmonic rejection circuit 66 includes an inductor Lct, a capacitor Cs coupled in series with inductor Lct, and a transistor Tcs'. Inductor Lct may have a first terminal coupled to the center tap of coil Ls and a second terminal coupled to ground line 68 via series-connected capacitor Cs. Transistor Tcs' may have a source terminal coupled to ground line 68, a drain terminal coupled to the center tap of secondary coil Ls, and a gate terminal configured to receive control voltage Vcs. Transistor Tcs' can serve as a current source or a current limiting device that help provide improved biasing flexibility for the mixing transistors within subcircuits 51-1 and 51-2 (e.g., control voltage Vcs can be adjusted to accommodate the optimum bias point at the gate terminals of the mixer transistors). Transistor Tcs' can therefore sometimes be referred to as a current source transistor or a current limiting transistor. The various implementations of harmonic rejection circuit 66 as shown in FIGS. 7-10 can be applied to harmonic rejection circuit 67 of the type shown in FIGS. 5B and 6.

Figure 11:
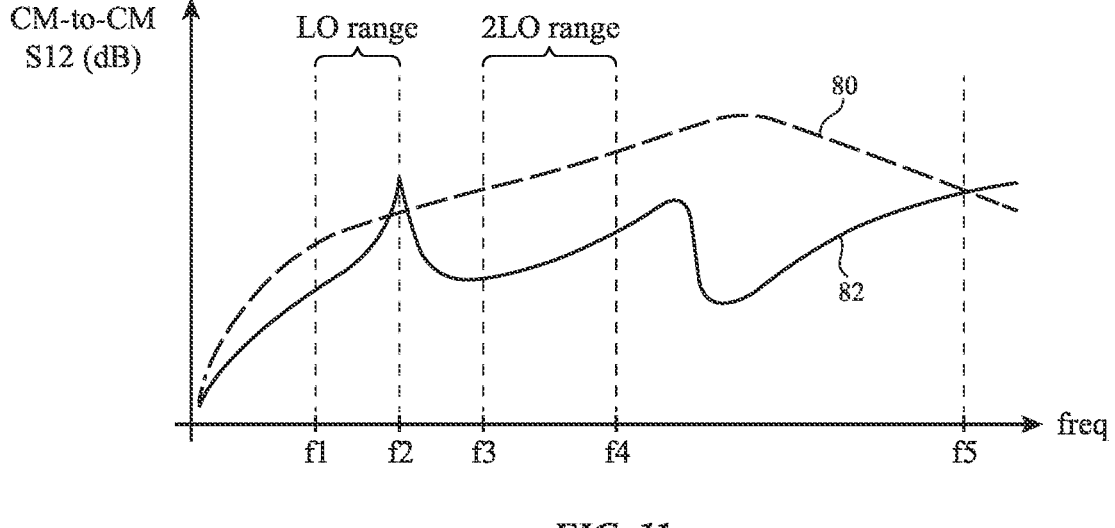
FIG. 11 is a plot showing how use of a local oscillator harmonic rejection circuit in a transformer based mixer can improve common-mode-to-common-mode rejection of a local oscillator signal in accordance with some embodiments.

The harmonic distortion signals associated with the local oscillator signals can have a differential mode component and a common mode component. FIG. 11 is a plot showing how use of LO harmonic rejection circuit 66 can improve common-mode-to-common-mode (CM-to-CM) rejection of a local oscillator signal. FIG. 11 plots the CM-to-CM reverse voltage gain (sometimes denoted the S12 parameter in the decibel scale) as a function of frequency from the source nodes of the mixing transistors (e.g., the source terminals of transistors 76-1a, 76-1b, 76-2a, and 76-2b) to the output of the transconductance stage (e.g., the drain terminals of input transistors 60-1 and 60-2). Curve 80 plots the S12 reverse voltage gain response for mixer circuitry that does not include LO harmonic rejection circuit 66, whereas curve 82 plots the S12 reverse voltage gain response for mixer circuitry 50 that includes LO harmonic rejection circuit 66. The frequency range from f1 to f2 represents the fundamental frequency range of the LO signal, whereas the frequency range from f3 to f4 represents the $2^{nd}$ harmonic frequency range of the LO signal. As shown in FIG. 11, use of LO harmonic rejection circuit 66 can help reduce the CM-to-CM reverse voltage gain for $2^{nd}$ harmonic LO signals and higher order harmonic LO signals up to frequency f5 (in the example of FIG. 11).

Figure 12:
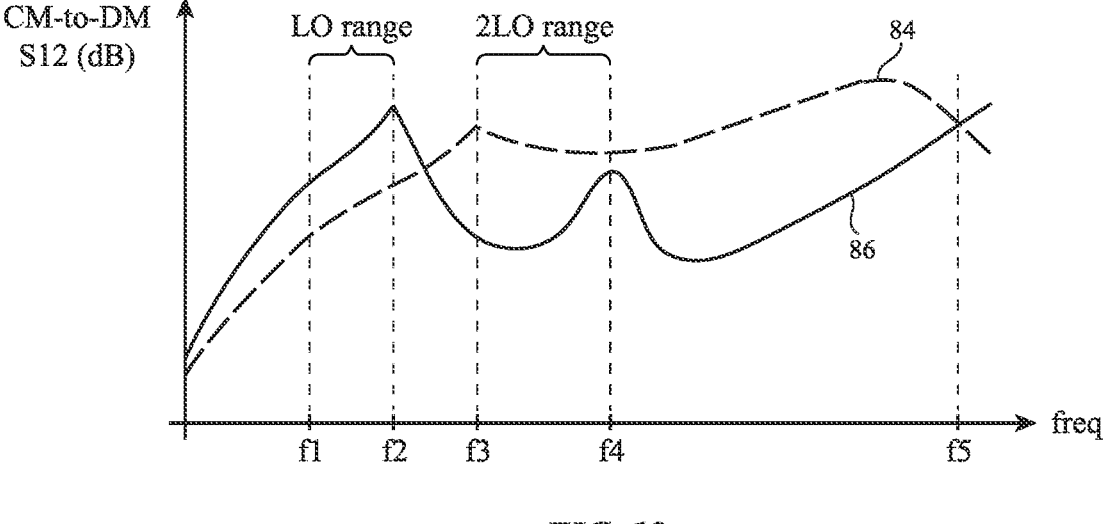
FIG. 12 is a plot showing how use of a local oscillator harmonic rejection circuit in a transformer based mixer can improve common-mode-to-differential-mode rejection of a local oscillator signal in accordance with some embodiments.

FIG. 12 is a plot showing how use of LO harmonic rejection circuit 66 can also improve common-mode-to-differential-mode (CM-to-DM) rejection of a local oscillator signal. FIG. 12 plots the CM-to-DM reverse voltage gain (sometimes denoted the S12 parameter in the decibel scale) as a function of frequency from the source nodes of the mixing transistors (e.g., the source terminals of transistors 76-1a, 76-1b, 76-2a, and 76-2b) to the output of the transconductance stage (e.g., the drain terminals of input transistors 60-1 and 60-2). Curve 84 plots the S12 reverse voltage gain response for mixer circuitry that does not include LO harmonic rejection circuit 66, whereas curve 86 plots the S12 reverse voltage gain response for mixer circuitry 50 that includes LO harmonic rejection circuit 66. The frequency range from f1 to f2 represents the fundamental frequency range of the LO signal, whereas the frequency range from f3 to f4 represents the $2^{nd}$ harmonic frequency range of the LO signal. As shown in FIG. 12, use of LO harmonic rejection circuit 66 can help reduce the CM-to-DM reverse voltage gain for $2^{nd}$ harmonic LO signals and higher order harmonic LO signals up to frequency f5' (in the example of FIG. 12). As illustrated by FIGS. 11 and 12, proper common mode terminal of secondary coil Ls using LO harmonic rejection circuit 66 can help reduce both the CM-to-CM and the CM-to-DM reverse voltage gain responses for a wide range of operating frequencies. As a result, multiple LO harmonics (e.g., $2^{nd}$ harmonics, $3^{rd}$ harmonics, $4^{th}$ harmonics, and higher) potentially generated at the output of the transconductance input cell can be mitigated.

The methods and operations described above in connection with FIGS. 1-12 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is illustrative and various modifications can be made to the described embodiments. The foregoing embodiments may be implemented individually or in any combination.

What is claimed is:

1. Mixer circuitry comprising:
a first mixer transistor configured to receive an oscillating signal;
a transformer having a primary coil and a secondary coil, the secondary coil being coupled to the first mixer transistor; and
an inductor directly coupled to a center tap of the secondary coil in the transformer, the center tap of the secondary coil being coupled to a power supply line via the inductor.

2. The mixer circuitry of claim 1, further comprising:
a second mixer transistor configured to receive the oscillating signal, the secondary coil having a first terminal that is coupled to source terminals of the first and second mixer transistors.

3. The mixer circuitry of claim 2, further comprising:
a third mixer transistor configured to receive the oscillating signal; and
a fourth mixer transistor configured to receive the oscillating signal, the secondary coil having a second terminal that is coupled to source terminals of the third and fourth mixer transistors.

4. The mixer circuitry of claim 3, wherein:
the first mixer transistor has a drain terminal coupled to a first output terminal of the mixer circuitry;
the second mixer transistor has a drain terminal coupled to a second output terminal of the mixer circuitry;
the third mixer transistor has a drain terminal coupled to the second output terminal of the mixer circuitry; and
the fourth mixer transistor has a drain terminal coupled to the first output terminal of the mixer circuitry.

5. The mixer circuitry of claim 4, further comprising:
an output inductor having a first terminal coupled to the first output terminal of the mixer circuitry, a second terminal coupled to the second output terminal of the mixer circuitry, and a center tap coupled to an additional power supply line.

6. The mixer circuitry of claim 1, further comprising:
a first input transistor coupled to a first terminal of the primary coil in the transformer; and
a second input transistor coupled to a second terminal of the primary coil in the transformer.

7. The mixer circuitry of claim 6, further comprising:
an input transformer coupled to gate terminals of the first and second input transistors;
a signal strength indicator circuit coupled to the input transformer; and
a passive component coupled to the input transformer.

8. The mixer circuitry of claim 1, further comprising:
a capacitor coupled in parallel with the inductor, the capacitor having a first terminal coupled to the first terminal of the inductor and having a second terminal coupled to the power supply line.

9. The mixer circuitry of claim 1, further comprising:
a capacitor coupled in series with the inductor, the capacitor having a first terminal coupled to the inductor and having a second terminal coupled to the power supply line.

10. The mixer circuitry of claim 9, further comprising:
a current source transistor coupled to a node disposed between the secondary coil and the inductor.

11. Mixer circuitry comprising:
a first input transistor;
a second input transistor;
a transformer having a primary coil coupled between the first and second input transistors and having a secondary coil;
a passive component coupled to a center tap of the secondary coil of the transformer; and
a current limiting transistor coupled to the passive component.

12. The mixer circuitry of claim 11, further comprising:
a first pair of mixer transistors coupled to a first terminal of the secondary coil and configured to receive an oscillator signal; and
a second pair of mixer transistors coupled to a second terminal of the secondary coil and configured to receive the oscillator signal.

13. The mixer circuitry of claim 12, wherein the passive component comprises an inductor.

14. The mixer circuitry of claim 13, further comprising a capacitor coupled to the inductor.

15. Circuitry comprising:
an input port;
an output stage configured to receive an oscillating signal;
a transformer having a primary winding coupled to the input port and having a secondary winding coupled to the output stage;
a first harmonic rejection circuit coupled to a center tap of the primary winding; and
a second harmonic rejection circuit coupled to a center tap of the secondary winding.

16. The circuitry of claim 15, further comprising:
a signal strength indicator (SSI) circuit coupled to the input port.

17. The circuitry of claim 15, wherein the output stage comprises:
a first pair of mixing transistors coupled to a first terminal of the secondary winding; and
a second pair of mixer transistors coupled to a second terminal of the secondary winding.

18. The circuitry of claim 15, wherein the harmonic rejection circuit comprises one or more passive components.

\* \* \* \* \*